(12) United States Patent
Burke

(10) Patent No.: US 7,721,347 B2
(45) Date of Patent: May 18, 2010

(54) SCANNING NANOTUBE PROBE DEVICE AND ASSOCIATED METHOD

(75) Inventor: Peter J. Burke, Irvine, CA (US)

(73) Assignee: RF Nano Corporation, Newport Beach, CA (US)

( * ) Notice: Subject to any disclaimer, the term of this patent is extended or adjusted under 35 U.S.C. 154(b) by 174 days.

(21) Appl. No.: 12/125,865

(22) Filed: May 22, 2008

(65) Prior Publication Data

US 2009/0055977 A1    Feb. 26, 2009

Related U.S. Application Data

(60) Provisional application No. 60/940,930, filed on May 30, 2007.

(51) Int. Cl.
*G01N 13/16* (2006.01)
(52) U.S. Cl. .............................. 850/63; 850/21; 73/105
(58) Field of Classification Search .................. 850/63, 850/21; 73/105
See application file for complete search history.

(56) References Cited

U.S. PATENT DOCUMENTS 6,957,154 B2    10/2005   Steele et al.
7,137,291 B2 *  11/2006   Mancevski ................... 73/105

FOREIGN PATENT DOCUMENTS

JP        2004-163390 A    6/2004

OTHER PUBLICATIONS

C. Kocabas, N. Pimparkar, O. Yesilyurt, S. J. Kang, M. A. Alam and J. A. Rogers, "Experimental and Theoretical Studies of Transport through Large Scale, Partially Aligned Arrays of Single-Walled Carbon Nanotubes in Thin Film Type Transistors", Nano Lett., 7, 1195-1202, (2007).
Vladimir, V. et al. "A Microfabricated Near-Field Scanned Microwave Probe for Noncontact Dielectric Constant Metrology of Low-k Films", Microwave Symposium Digest 2006, IEEE MTT-S International, Jun. 2006, pp. 1618-1621.
Lin, J. M. et al. "Non-contact Mode SPM System Design by Integrating MEMS Electro-static Micro-probe & Laser Doppler Interferometer" In: IEEE International Conference on Systems, Man and Cybernetics. Taipei : IEEE, 2006, pp. 4591-4596.
Form PCT/ISA/210 in connection with PCT/US2008/064836; dated May 18, 2009.
Form PCT/ISA/237 in connection with PCT/US2008/064836; dated May 18, 2009.

\* cited by examiner

*Primary Examiner*—Kiet T Nguyen
(74) *Attorney, Agent, or Firm*—Bradley D. Blanche; Greenberg Traurig, LLP

(57) ABSTRACT

A method and device are provided for determining, without contact, the physical and electrical properties of nanotube materials. The device includes a scanning probe configured to generate a signal of certain frequency onto the nanotube material and measure a reflected signal from the nanotube material, and a processor coupled to the scanning probe and configured to determine the physical and electrical properties of the nanotube material from the measured reflected signal. The method includes positioning a scanning probe relative to the nanotube material, generating a signal of certain frequency onto the nanotube material, and measuring a reflected signal from the nanotube material.

17 Claims, 2 Drawing Sheets

SCANNING NANOTUBE PROBE DEVICE AND ASSOCIATED METHOD

RELATED APPLICATION

This application claims the benefit of and priority to U.S. Provisional Application Ser. No. 60/940,930, filed May 30, 2007, the contents of which are incorporated by reference herein in its entirety.

TECHNICAL FIELD

This disclosure relates generally to nanotube materials and, more particularly, to a method and device for determining the physical and electrical characteristics of a nanotube material.

BACKGROUND

Prior attempts at nanotube characterization have involved making multiple electrodes on a nanotube coated wafer and measuring their electrical properties. However, this approach requires numerous steps, requires manipulating and contacting the wafer and cannot be used in a way that allows inspection only of the wafer.

SUMMARY

According to a feature of the disclosure, a method and device are provided to determine, without contact, the physical and electrical properties of a nanotube material. The device includes a scanning probe coupled to a processor. The scanning probe is configured to generate a signal of certain frequency onto the nanotube material and measure a reflected signal from the nanotube material. The processor may be configured to determine the sheet resistance of the nanotube material from the measured reflected signal. The method includes positioning a scanning probe relative to the nanotube material, generating a signal of certain frequency onto the nanotube material, and measuring a reflected signal from the nanotube material.

In one embodiment, the scanning probe includes at least one of a dipole antenna at the end of a coax, a loop (magnetic dipole) antenna at the end of a coax, an open ended waveguide (circular or rectilinear), a radiating structure at the end of a waveguide, or any radiating structure at the end of a coax or waveguide. The certain frequency may be selected from a group consisting of a radio frequency and a microwave frequency, for example, from 1 Hz to 1 THz or higher. The processor may further be configured to generate a map of a reflection coefficient vs. the position of the nanotube material relative to the scanning probe. In one embodiment, the map provides uniformity characteristics and alignment information of the nanotube material.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

In the description that follows, the present invention will be described in reference to a preferred embodiment for probing nanotube materials. The present invention, however, is not limited to any particular application nor is it limited by the examples described herein. Therefore, the description of the embodiments that follow are for purposes of illustration and not limitation.

Figure 1:
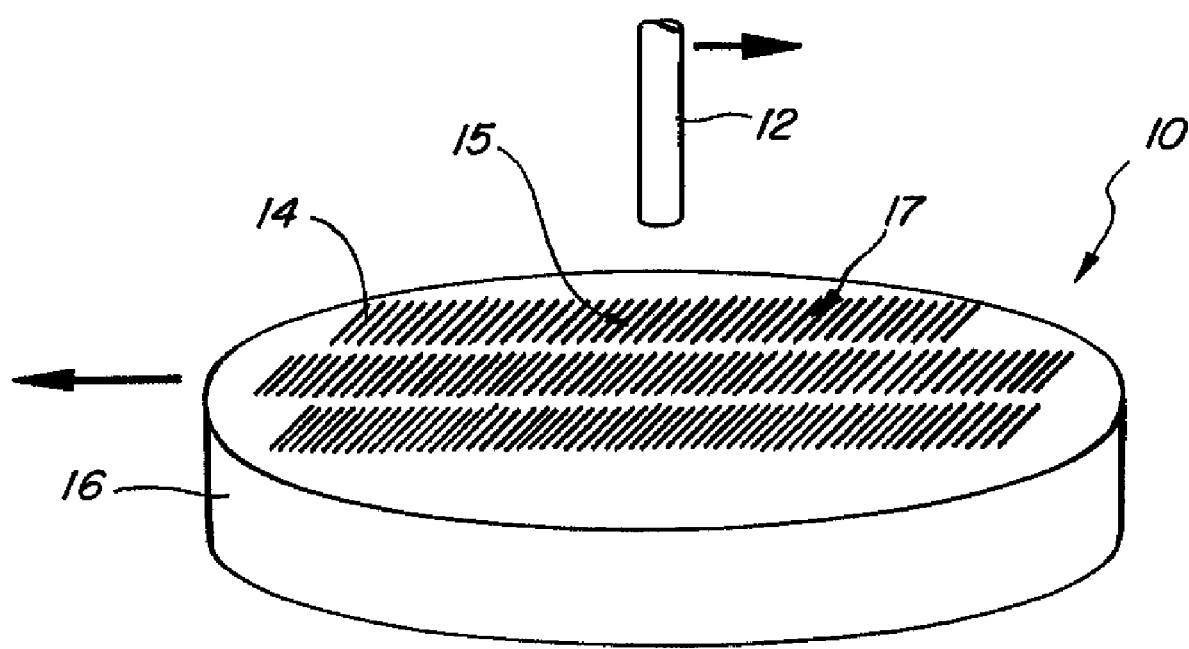
FIG. 1 is an illustration of a nanotube probing device in accordance with one embodiment of the present disclosure.

In one embodiment, the present disclosure is directed to a method and device for determining on a wafer scale the physical and electrical properties of nanotubes, nanotube arrays, and nanotube mattes, without contact, using a scanning probe. FIG. 1 is an illustration of a nanotube probing device 10 in accordance with one embodiment of the present disclosure. The nanotube probing device 10 may include a scanning probe 12 positionable above nanotube material 14 and substrate wafer 16.

The scanning probe 12 may be used to determine the physical and electrical characteristics of nanotube materials 14 without contacting the nanotube material 14. As the scanning probe 12 and/or the nanotube materials 14 are moved with respect to one another, as illustrated in FIG. 1, a processor, such as a network analyzer (not shown), coupled to the scanning probe 12 measures the reflected power to provide a "map" of the microwave reflection coefficient vs. position of the wafer 16.

The scanning probe 12 may, for example, include but is not limited to (1) a dipole antenna at the end of a coax, (2) a loop (magnetic dipole) antenna at the end of a coax, (3) an open ended waveguide (circular or rectilinear), or (4) any other radiating structure at the end of a waveguide or coax. As can be envisioned by a person skilled in the art, the dimensions of the scanning probe 12 may range from the nanoscale to the macroscale, and the frequency of the scanning probe 12 may range from just above dc to THz. In one embodiment, the scanning probe 12 may utilize radio frequency (RF) or microwave frequency to generate radiation above nanotube material 14 and substrate wafer 16.

In one embodiment, the network analyzer (not shown) coupled to the scanning probe 12 may be used to measure the power reflected from the nanotube material 14 as the scanning probe 12 and/or the nanotube material 14 are moved with respect to one another. As is understood by a person skilled in the art, scanning by be accomplished by moving the probe 12 across the wafer 16, moving the wafer 16 while the probe 12 is held stationary, or moving the probe 12 and the wafer 16 relative to each other.

Figure 2:
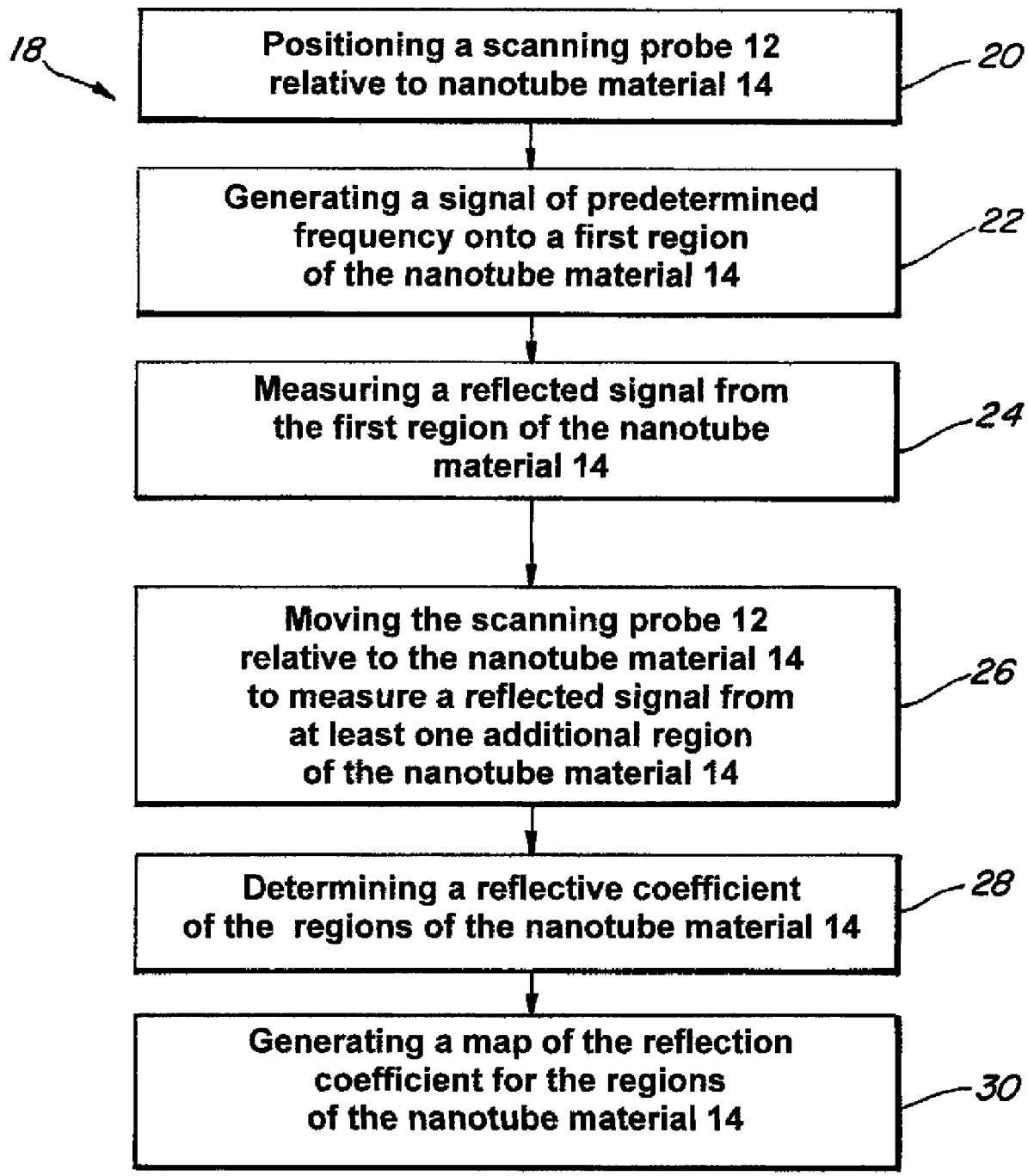
FIG. 2 is an exemplary flow chart outlining the operation of the nanotube probing device of FIG. 1, according to one embodiment of the present disclosure.

FIG. 2 is an exemplary flow chart 18 outlining the operation of the nanotube probing device 10 of FIG. 1, according to one embodiment of the present disclosure. In operation, the scanning probe 12 may be positioned besides (and/or relative to) the nanotube material 14 and substrate wafer 16 (20). A signal of certain frequency is generated onto a first region 15 of the nanotube material 14 and substrate wafer 16 (22). The reflected signal may then be measured by the scanning probe 12 (24). The scanning probe 12 may be moved, at least once, adjacent to a second region 17 of the nanotube material 14 and substrate wafer 16 to measure reflected signal at that region (26). The reflection coefficient of the first and second regions of the nanotube material 14 (and all additional regions of the nanotube material 14 where the probe 12 was moved relative to the nanotube material to measure reflected signals) is determined from the measured reflected signal measurements (28). A "map" of the wafer may then be generated from the combination of reflected signal measurements and the sheet resistance of the nanotube material 14 may be ascertained (30).

In one embodiment, the "map" of the reflection coefficient vs. position of the wafer 16 may be generated from the reflected signal measurements. The resolution of this map may be provided by a convolution of the probe 12 radiation pattern together with the mechanical resolution of the scanning instrument. The map may be used to provide uniformity characteristics of the nanotube material 14 over the entire substrate wafer 16 and alignment information about the nanotube material 14 over the entire substrate wafer 16. In one embodiment, signal processing and modeling of the reflected signal measurements may be used to determine the sheet resistance (resistance per square) of the nanotube material 14. For example, the sheet resistance (electrical property) may be determined by first computing the reflection coefficient using the following equation:

$$S_{11} = \frac{V_{reflected}}{V_{incident}} \quad (1)$$

where,
$S_{11}$ is the power reflection coefficient,
$V_{reflected}$ is the amplitude of the reflected signal on the coax, and
$V_{incident}$ is the amplitude of the incident signal on the coax.

The power reflection coefficient of equation (1) may be used to determine the load impedance Z using, for example, the equation:

$$S_{11} = \frac{Z - 50}{Z + 50} \quad (2)$$

where,
$S_{11}$ is the power reflection coefficient, and
Z is the load impedance.

Since the load impedance Z is proportional to sheet resistance of the nanotube material 14 (in certain probe geometries), the sheet resistance of the nanotube material 14 may be ascertained. Determining the sheet resistance of the nanotube material 14 may be particularly useful in line manufacturing and characterization of nanotube and nanowire coated wafers, where electrical devices with uniform electrical properties are desired.

In one embodiment, the distance between the scanning probe 12 and the substrate wafer 16 may place the nanotube material 14 in the near field of the probe. However, in other embodiments, if high enough frequencies are used, far-field probing may also be utilized.

As can be seen from the above, the present disclosure describes a method and device for determining, on a wafer scale, the physical and electrical characteristics of nanotubes, nanotube arrays, and nanotube mattes, without contact, using a microwave probe.

While the nanotube probing device and associated method have been described in terms of what are presently considered to be the most practical and preferred embodiments, it is to be understood that the disclosure need not be limited to the disclosed embodiments. It should also be understood that a variety of changes may be made without departing from the essence of the invention. Such changes are also implicitly included in the description. They still fall within the scope of this invention. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. A device for determining an electrical characteristic of a nanotube material without contacting the nanotube material, comprising:
    a scanning probe configured to generate a signal of certain frequency onto the nanotube material and measure a reflected signal from the nanotube material; and
    a processor coupled to the scanning probe and configured to determine the electrical characteristic of the nanotube material from the measured reflected signal.

2. The device of claim 1, wherein the scanning probe generates RF radiation in proximity of the nanotube material.

3. The device of claim 1, wherein the scanning probe comprises at least one of a dipole antenna at the end of a coax, a loop (magnetic dipole) antenna at the end of a coax, an open ended waveguide (circular or rectilinear), a radiating structure at the end of a waveguide, and a radiating structure at the end of a coax.

4. The device of claim 1, wherein the processor is configured to compute a power reflection coefficient.

5. The device of claim 4, wherein the processor is configured to map the reflection coefficient vs. the position of the nanotube material relative to the scanning probe.

6. The device of claim 1, wherein the electrical characteristic of the nanotube is sheet resistance.

7. The device of claim 1, wherein the processor is configured to determine uniformity characteristics and alignment information of the nanotube material.

8. The device of claim 1, wherein the certain frequency is selected from a group consisting of a radio frequency and a microwave frequency.

9. A contactless method for determining an electrical characteristic of a nanotube material without contacting the nanotube material, comprising:
    positioning a scanning probe relative to the nanotube material;
    generating a signal of certain frequency onto the nanotube material;

measuring a reflected signal from the nanotube material; and determining the electrical characteristic of the nanotube material from the measured reflected signal.

10. The method of claim 9, further comprising determining a power reflection coefficient from the measured reflected signal.

11. The method of claim 9, further comprising generating a map of a reflection coefficient vs. the position of the nanotube material relative to the scanning probe.

12. The method of claim 9, further comprising determining uniformity characteristics and alignment information of the nanotube material.

13. The method of claim 9, further comprising determining a sheet resistance of the nanotube material from the measured reflected signal.

14. The method of claim 9, wherein the certain frequency is selected from a group consisting of a radio frequency and a microwave frequency.

15. The method of claim 9, wherein the scanning probe comprises at least one of a dipole antenna at the end of a coax, a loop (magnetic dipole) antenna at the end of a coax, an open ended waveguide (circular or rectilinear), a radiating structure at the end of a waveguide, and a radiating structure at the end of a coax.

16. The method of claim 9, further comprising:

moving the scanning probe relative to the nanotube material to a new position;

generating a second signal of certain frequency onto a region of the nanotube material at the new position; and measuring a second reflected signal from the region of the nanotube material at the new position.

17. The method of claim 16, further comprising:

determining a reflection coefficient for each of the regions of the nanotube material; and generating a map of the reflection coefficient for each of the regions of the nanotube material.

* * * * *